United States Patent
Chang et al.

(10) Patent No.: US 7,359,280 B2
(45) Date of Patent: Apr. 15, 2008

(54) LAYOUT STRUCTURE FOR SUB WORD LINE DRIVERS AND METHOD THEREOF

(75) Inventors: Soo-Bong Chang, Seoul (KR); In-Chul Jeong, Suwon-si (KR); Jun-Hyung Kim, Suwon-si (KR); Seung-Min Oh, Suwon-si (KR); Jung-Hwa Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 245 days.

(21) Appl. No.: 11/336,831

(22) Filed: Jan. 23, 2006

(65) Prior Publication Data

US 2006/0163613 A1 Jul. 27, 2006

(30) Foreign Application Priority Data

Jan. 24, 2005 (KR) ....................... 10-2005-0006227
Dec. 15, 2005 (KR) ....................... 10-2005-0123745

(51) Int. Cl.
*G11C 8/00* (2006.01)

(52) U.S. Cl. ............... 365/230.06; 365/63; 365/230.03

(58) Field of Classification Search .................. 365/63, 365/230.03, 230.06
See application file for complete search history.

(56) References Cited

U.S. PATENT DOCUMENTS

| 5,604,697 A | 2/1997 | Takahashi et al. |
| 6,236,617 B1 | 5/2001 | Hsu et al. |
| 7,016,214 B2 * | 3/2006 | Kawamata et al. ........... 365/63 |

* cited by examiner

*Primary Examiner*—Hoai V. Ho
(74) *Attorney, Agent, or Firm*—Harness, Dickey & Pierce, P.L.C.

(57) ABSTRACT

A layout structure for sub word line drivers and method thereof. The example layout structure may include at least one N-channel transistor arrangement having a cross sectional width and a cross sectional length, the N-channel transistor arrangement oriented such that the cross sectional length extends along a first direction, the first direction oriented along a sub word line driver from a first sub array block to a second sub array block. The example method may arrange the at least one N-channel transistor between the first and second sub array blocks.

29 Claims, 6 Drawing Sheets

LAYOUT STRUCTURE FOR SUB WORD LINE DRIVERS AND METHOD THEREOF

PRIORITY STATEMENT

This application claims the benefit of Korean Patent Application No. 10-2005-0006227, filed Jan. 24, 2005 and Korean Patent Application No. 10-2005-0123745, filed Dec. 15, 2005, the disclosure both of which is hereby incorporated herein by reference in their entirety.

BACKGROUND OF THE INVENTION

1. Field of the Invention

Example embodiments of the present invention relate generally to a sub word-line driver and method thereof, and more particularly to a layout structure for a sub word-line driver and method thereof.

2. Description of the Related Art

A memory cell array of a conventional semiconductor memory device may be divided into four memory banks, with each memory bank divided into a plurality of memory blocks. Each memory block may be divided into a plurality of sub array blocks. Higher integration memory cell arrays may employ a word line driver structure having a plurality of sub word line drivers. The sub word line drivers may be positioned between adjacent sub array blocks in order to reduce a delay (e.g., an interconnect delay) by a line load of the word line due to an elongated interconnect length.

For example, in a semiconductor memory device having 256 megabits (Mb) of memory capacity, a memory cell array may be divided into four memory banks, with each memory bank having 32 memory blocks positioned in a longitudinal direction of a chip (e.g., a semiconductor memory chip). Each of the memory blocks may have 16 sub array blocks in a width direction of the chip. The sub word line drivers may be positioned between the sub array blocks.

FIG. 1 illustrates an array of sub array blocks and sub word line drivers in a conventional semiconductor memory device. Referring to FIG. 1, the conventional semiconductor memory device may include a plurality of sub array blocks (SBs) 20 and a plurality of sub word line driver blocks (SWDBs) 10 positioned between the SBs 20.

At least one of the SBs 20 may include a plurality of memory cells, with each of the plurality of memory cells connected to a word line and a bit line. One of the SWDBs 10 may include a plurality of sub word line driver circuits (SWDs), which may be connected to the word lines, respectively, which may thereby be connected to the plurality of memory cells. Any of the word lines may be selected in response to input signals (Pxi0 to Pxi3).

FIG. 2 illustrates an array of a representative SWDB 10 of FIG. 1. Referring to FIG. 2, the SWDB 10 may include a plurality of SWDs. The sub word line drivers 12 and 14 may repeat in a lengthwise direction with respect to the bit line.

Referring to FIG. 2, an aligned (e.g., adjacent) pair of sub word line drivers 12 and 14 may be driven by the same input signal. The aligned pair of sub word line drivers 12 and 14 may be positioned at an upper or lower portion, respectively, in a lengthwise direction with respect the word line of the SBs 20 of FIG. 2.

Four word lines may be sequentially arranged as a first word line, a second word line, a third word line and a fourth word line. The first word line may be connected to the sub word line driver 12 positioned under the sub array block 20, the second word line may be connected to the sub word line driver 12 positioned above the sub array block 20, the third word line may be connected to the sub word line driver 14 positioned under the sub array block 20, and the fourth word line may be connected to the sub word line driver 14 positioned above the sub array block 20.

FIG. 3 is a circuit diagram illustrating an adjacent pair of the sub word line drivers 12 and 14 of FIG. 2. In an example, the sub word line drivers 12 and 14 of FIG. 2 may be representative of sub array blocks positioned either above or below a respective sub word line driver.

Referring to FIG. 3, the sub word line drivers 12 and 14 may receive first and second input signals A and B and may include first and second P-channel transistors P1 and P2 and first to fourth N-channel transistors N1, N2, N3 and N4. The sub word line driver 12 may include the first P-channel transistor P1, the first N-channel transistor N1 and the third N-channel transistor N3. The first P-channel transistor P1 may be connected between a conductive line connected to a power line and one of the plurality of word lines WL0 in a sub array block (e.g., sub array block 20). The first P-channel transistor P1 may be driven by the first input signal A. The power line may apply an external power voltage level VPP which may have a higher voltage level as compared to an internal power voltage VDD.

The first N-channel transistor N1 may be connected between the conductive line connected to the word line WL0 and a ground voltage. The first N-channel transistor N1 may be driven by the first input signal A. The third N-channel transistor N3 may be connected between the conductive line connected to the word line WL0 and the ground voltage. The third N-channel transistor N3 may be driven by the second input signal B.

The sub word line driver 14 may include the second P-channel transistor P2, the second N-channel transistor N2 and the fourth N-channel transistor N4. The second P-channel transistor P2 may be connected between a conductive line connected to a power line and a word line WL1 in the sub array block. The second P-channel transistor P2 may be driven by the first input signal A. The power line may apply an external power voltage level VPP which may have a higher voltage level as compared to an internal power voltage VDD.

The second N-channel transistor N2 may be connected between the conductive line connected to the word line WL1 and the ground voltage. The second N-channel transistor N2 may be driven by the first input signal A. The fourth N-channel transistor N4 may be connected between the conductive line connected to the word line WL1 and the ground voltage. The fourth N-channel transistor N4 may be driven by the second input signal B.

The first input signal A may enable the word lines WL0 and WL1 with an operation of the sub word line drivers 12 and 14 and the second input signal B may pre-charge the word lines. The sub word line drivers may be responsive to the same input signals (e.g., first and second input signals A and B) where only one word line may be enabled by PXi coding at any given time.

In conventional operation of the sub word line drivers 12 and 14, if at least one (e.g., one, both, etc.) of the first input signal A and the second input signal B are set to a first logic level (e.g., a higher logic level or logic "1"), the word line WL0 may be disabled (e.g., set to the ground voltage).

In conventional operation of the sub word line drivers 12 and 14, if the first input signal A and the second input signal B are set to a second logic level (e.g., a lower logic level), the external power voltage level VPP may be applied to the word line WL0 to enable the enable the word line WL0 (e.g., set to a voltage other than the ground voltage). The four sub word line drivers having the same input line may enable a single word line based on the input signals.

Conventional semiconductor memory devices having a sub word line driver structure as described above may have an increased layout area. Accordingly, reducing the layout area may be an important design characteristic.

As illustrated in FIGS. 2 and 3, the sub word line drivers 12 and 14 may be positioned between an "upper" sub array block 20 and a "lower" sub array block 20 in a lengthwise direction of the word lines. Conventional sub word line driver layout structures may have an increased layout area, thereby reducing an integration efficiency of semiconductor memory devices including the conventional sub word line drivers.

SUMMARY OF THE INVENTION

An example embodiment of the present invention is directed to a layout structure for a first sub word line driver positioned between first and second sub array blocks, including at least one N-channel transistor arrangement having a cross sectional width and a cross sectional length, the N-channel transistor arrangement oriented such that the cross sectional length extends along a first direction, the first direction oriented along the sub word line driver from the first sub array block to the second sub array block.

Another example embodiment of the present invention is directed to a method of arranging a layout structure for a first sub word line driver positioned between first and second array blocks, including forming a first at least one N-channel transistor arrangement having a cross sectional width and a cross sectional length, the cross sectional length extending along a first direction, the first direction oriented along the sub word line driver from the first sub array block to the second sub array block.

In accordance with yet another example embodiment of the present invention, there is provided a layout structure for disposing two P-channel transistors and four N-channel transistors so as to be adjacent to each other in a first direction. The layout structure may include first and second P-channel transistors disposed vertically adjacent to each other, and adopting a first gate line as a gate of each thereof, the first gate line being elongatedly disposed on a well region in the first direction, the well region being disposed at a fixed width and length with the first direction adopted as a lengthwise direction. The first and second N-channel transistors may be disposed on a lower portion of the well region on the basis of the first direction so as to be vertically adjacent to each other and may adopt a second gate line as a gate of each thereof. The third and fourth N-channel transistors may be disposed on a lower portion of the second N-channel transistor with respect to the first direction so as to be vertically adjacent to each other, may adopt third and fourth gate lines as gates thereof, and sharing one of conductive regions with each other, the third and fourth gate lines being elongatedly disposed in parallel in a second direction perpendicular to the first direction. The first P-channel transistor may share at least one conductive region with a first other P-channel transistor adjacent to the right side thereof with respect to the first direction, and the second P-channel transistor may share at least one other conductive region with a second other P-channel transistor adjacent to the left side thereof with respect to the first direction. Further, the first N-channel transistor may share at least one conductive region with a first other N-channel transistor adjacent to the right side thereof with respect to the first direction, and the second N-channel transistor may share at least one conductive region with a third other N-channel transistor adjacent to the left side thereof with respect to the first direction.

In an example, the well region may include guard rings for well bias which may be disposed on an upper portion of an array region of the first P-channel transistor and a lower portion of an array region of the second P-channel transistor, the upper and lower portions determined based on the first direction. Further, the first and second P-channel transistors and the first and second N-channel transistors may adopt the first direction as a gate width direction, and the third and fourth N-channel transistors may adopt the first direction as a gate length direction. In addition, non-shared conductive regions may smaller than shared conductive regions. In another example, the well region may include a guard ring for well bias which may be disposed on an upper portion of an array region of the first P-channel transistor on the basis of the first direction, and the second conductive region may be positioned opposite to a region on which a guard ring for sub bias may be disposed. The guard ring for sub bias may be disposed on the other region than a first conductive region of the fourth N-channel transistor.

In another example embodiment of the present invention, a layout area of the sub word line drivers can be reduced, which is suitable for high integration of the semiconductor memory device.

BRIEF DESCRIPTION OF THE DRAWINGS

The accompanying drawings are included to provide a further understanding of example embodiments of the present invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
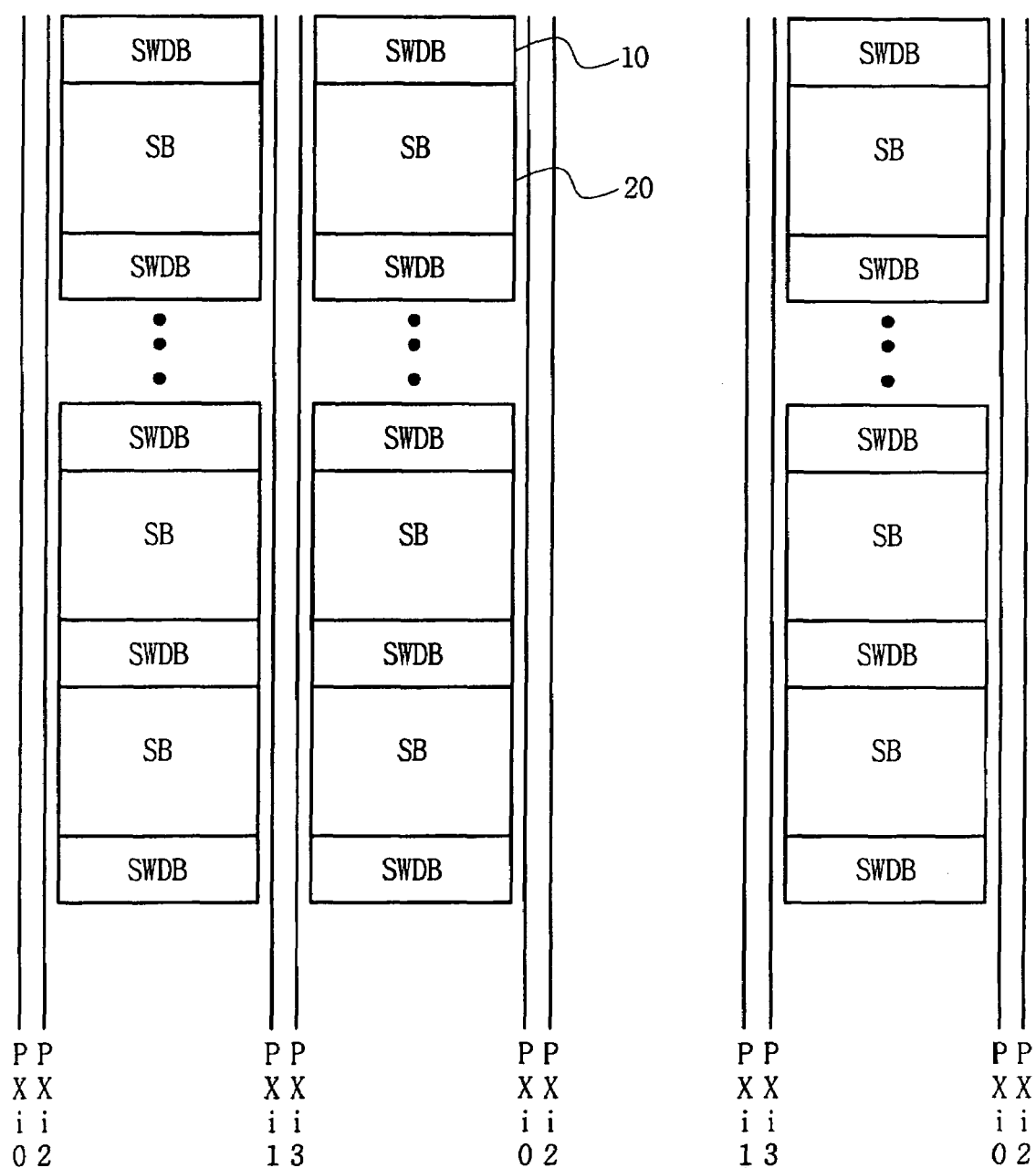
FIG. 1 illustrates an array of sub array blocks and sub word line drivers in a conventional semiconductor memory device.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but conversely, the invention is to cover all modifications, equivalents, and alternatives falling within the spirit and scope of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected", "mounted on", "on" or "coupled" to another element, it can be directly connected/mounted on/on/coupled to the other element or intervening elements may be present. Conversely, when an element is referred to as being "directly connected", "directly mounted on", "directly on", "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, it is understood that any "directional" terms, such as "right", "left", "top", "bottom", "above", "below", etc., are intended to be interpreted as relative terms within the context they are presented. Accordingly, if element A is to the "right" of element B in one example embodiment, A may be oriented to the "left" of B either in another example embodiment or in the same example embodiment presented in an alternative fashion (e.g., a different perspective).

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present invention will be described in detail with reference to the accompanying drawings.

In the Figures, the same reference numerals are used to denote the same elements throughout the drawings.

Figure 3:
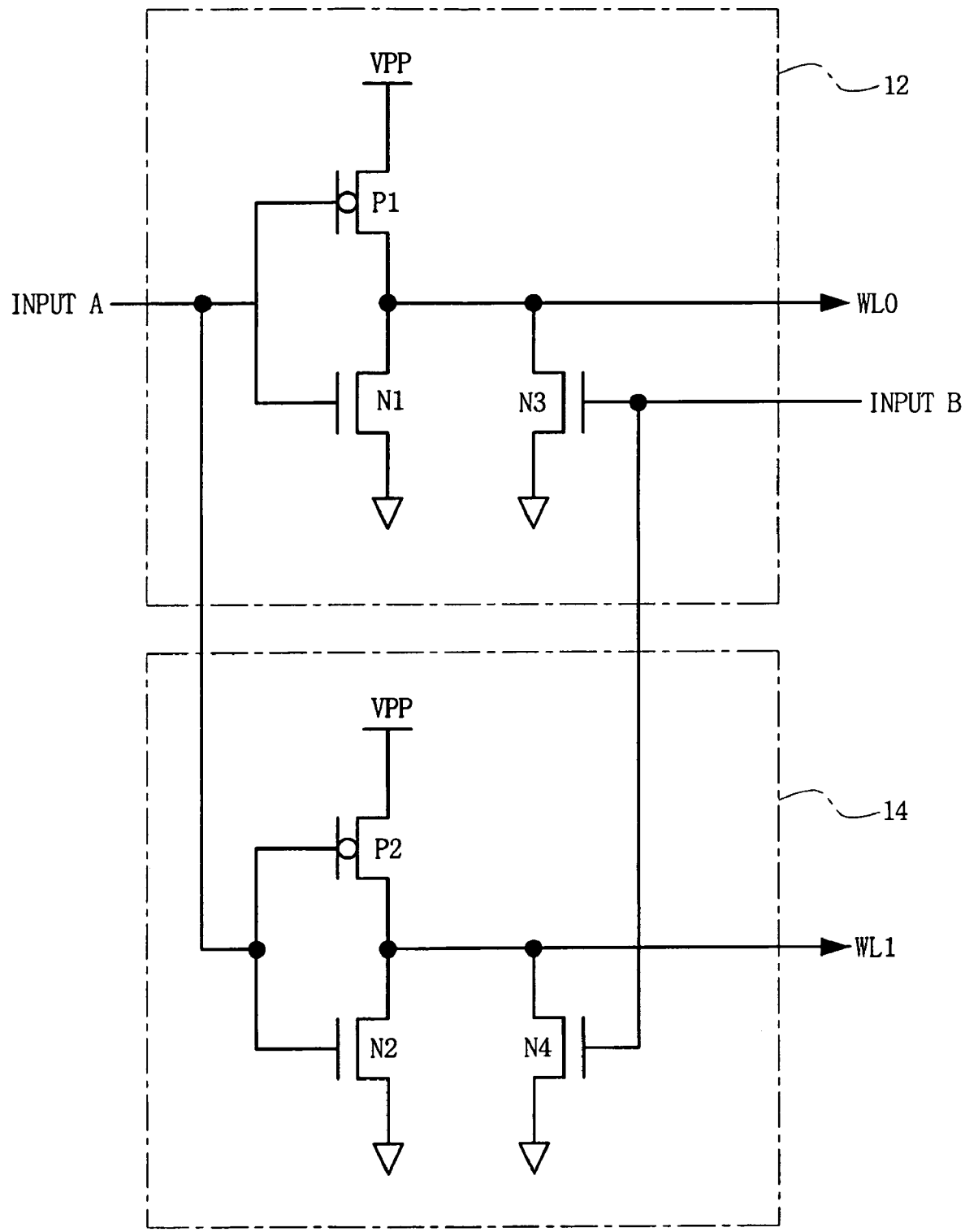
FIG. 3 is a circuit diagram illustrating an adjacent pair of sub word line drivers.
Figure 4:
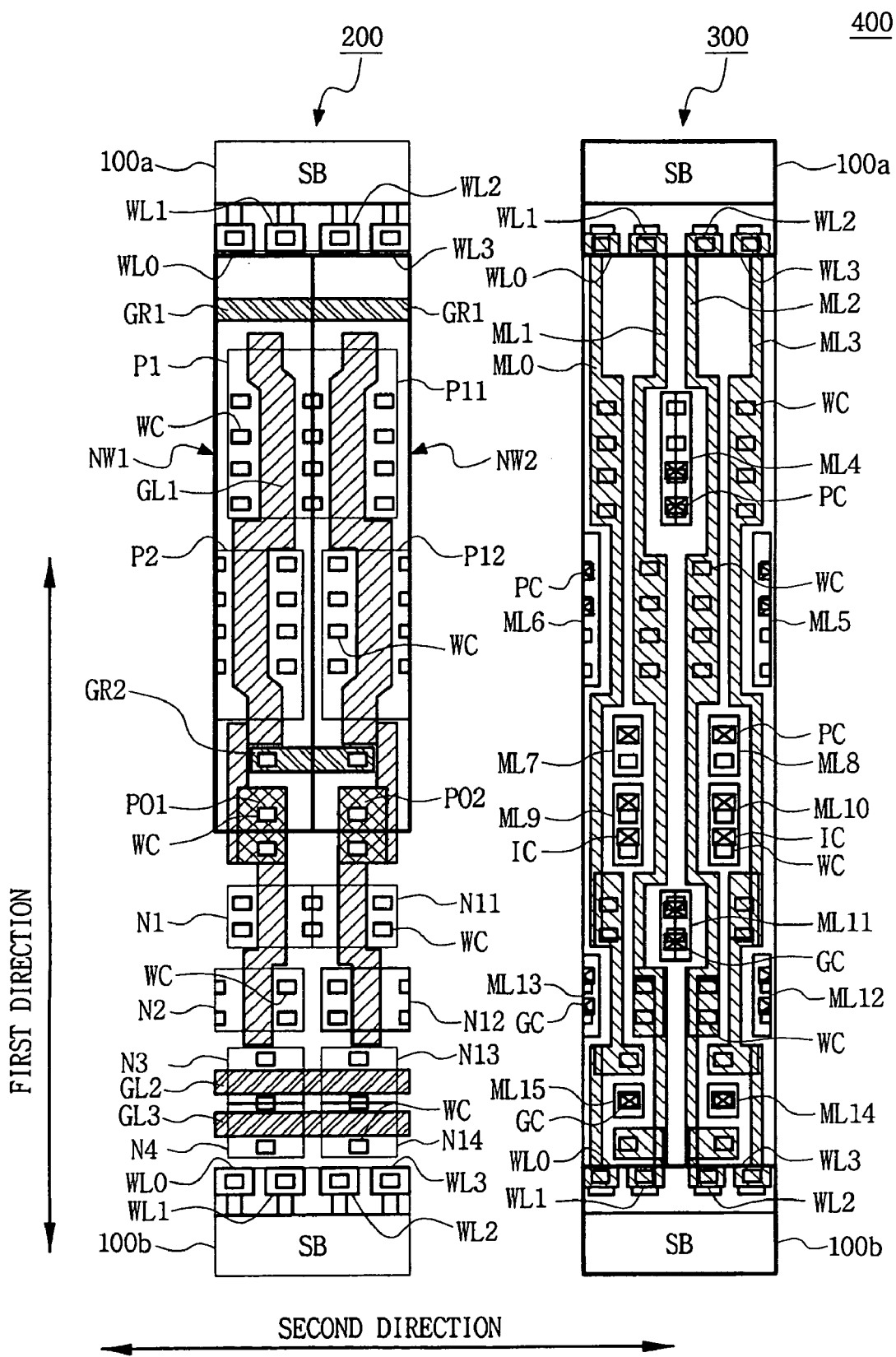
FIG. 4 illustrates a layout structure for sub word line drivers according to an example embodiment of the present invention.

FIG. 4 illustrates a layout structure 400 for sub word line drivers according to an example embodiment of the present invention. The circuitry illustrated in the example embodiment of FIG. 4 may perform a function equivalent to the conventional circuitry of FIG. 3 despite the different circuitry arrangement and/or layout structure.

In the example embodiment of FIG. 4, the layout structure 400 may include a left side 200 having an array of transistors collectively forming the sub word line drivers, and a right side 300 having an array of wire lines formed on (e.g., mounted on) transistors of the sub word line drivers.

The layout structure 400 of FIG. 4 will hereinafter be described with reference to the conventional circuit diagram of FIG. 3. It is understood that while the conventional circuitry of FIG. 3 and the layout structure 400 of FIG. 4 may be functionally equivalent, the arrangement or layout structure present in FIG. 4 may be different than conventional layout structures.

In the example embodiment of FIG. 4, the left side 200 may include an array structure with transistors P1, P2, N1, N2, N3 and N4 collectively forming a structure functionally equivalent to the sub word line drivers 12 and 14 of FIG. 3.

An array structure of a first P-channel transistor P1, a second P-channel transistor P2, a first N-channel transistor N1, a second N-channel transistor N2 and input lines will now be described.

In the example embodiment of FIG. 4, a common gate line GL1 for gate regions and input lines of the first and second P-channel transistors P1 and P2 and the first and second N-channel transistors N1 and N2 may be positioned along a first direction, where the first direction may be a lengthwise direction with respect to a word line. The common gate line GL1 may be positioned in a region including the first P-channel transistor P1 and the second N-channel transistor N2.

In the example embodiment of FIG. 4, the first P-channel transistor P1 may be positioned such that the common gate line GL1 may be a gate region which may include first and second conductive regions on adjacent sides (e.g., left and right sides, respectively) of the gate region. The first direction may thereby become a gate width direction of the first P-channel transistor P1. The first P-channel transistor P1 may share the second conductive region and a P-channel transistor P11 (e.g., of another sub word line driver) positioned on a first adjacent side (e.g., a right side) of a center line (not shown) of the left side 200 along the first direction. The first P-channel transistor P1 may be arranged to be symmetric over a center line (not shown) of the left side 200 along the first direction. If the first P-channel transistor P1 is a MOS (e.g., PMOS) transistor, the first conductive region may be a source/drain region and the second conductive region may be a drain/source region.

In the example embodiment of FIG. 4, the second P-channel transistor P2 may be positioned adjacent to the first P-channel transistor P1 and "downwards" with respect to the first direction such that the common gate line GL1 may be a gate region which may include the first and second conductive regions on adjacent sides (e.g., right and left, respectively) of the gate region. The second P-channel transistor P2 may be positioned such that the first direction may be a gate width direction. The second P-channel transistor P2 may share the second conductive region and a P-channel transistor (not shown) (e.g., of another sub word line driver) positioned on a second adjacent side (e.g., a left side) of the center line (not shown) of the left side 200 along the first direction. The second P-channel transistor P2 may be arranged to be symmetric over the center line (not shown) of the left side 200 along the first direction. If the second P-channel transistor P2 is a MOS (e.g., PMOS) transistor, the first conductive region may be a source/drain region and the second conductive region may be a drain/source region.

In the example embodiment of FIG. 4, the second P-channel transistor P2 and the first P-channel transistor P1 may be arranged such that the directions sharing the respective second conductive regions may be different with respect to one another. Contacts WC may be positioned at the first and second conductive regions of the first and second P-channel transistors P1 and P2 so as to be electrically connected with the wire lines upward (e.g., with respect to the first direction) thereof.

In the example embodiment of FIG. 4, first and second active guard-rings GR1 and GR2 may provide a back bias of the first and second P-channel transistors P1 and P2. The first and second active guard-rings GR1 and GR2 may be positioned at the upper and lower portions, respectively, of the first and second P-channel transistors P1 and P2 in the first direction.

In the example embodiment of FIG. 4, a contact WC may be used to establish a connection with a first input line and may be positioned on a portion PO1 on the common gate line to which a first input signal A of the sub word line drivers may be received. The portion PO1 may be positioned adjacent to the second active guard-ring GR2 in the first direction.

In the example embodiment of FIG. 4, the first N-channel transistor N1 may be positioned adjacent to the portion PO1 on the common gate line GL1 (e.g., to where the first input signal A may be received), and downward with respect to the first direction such that the common gate line GL1 may be a gate region having first and second conductive regions on adjacent sides (e.g., left and right sides) of the gate region with reference to the first direction. The first N-channel transistor N1 may be positioned along the first direction as a gate width direction. The first N-channel transistor N1 may share the second conductive region and an N-channel transistor N11 (e.g., of another sub word line driver) positioned on the first adjacent side (e.g., the right side) of the first direction. The first N-channel transistor N1 may be positioned to be symmetric over the first direction. If the first N-channel transistor N1 is a MOS (e.g., NMOS) transistor, the first conductive region may be a source/drain region and the second conductive region may be a drain/source region.

In the example embodiment of FIG. 4, the second N-channel transistor N2 may be adjacent to the first N-channel transistor N1 and may be downward thereof in the first direction such that the common gate line GL1 may be a gate region having second and first conductive regions on adjacent sides (e.g., left and right sides) of the gate region with respect to a center line arranged along the first direction. The second N-channel transistor N2 may be positioned along the first direction as a gate width direction. The second N-channel transistor N2 may share the second conductive region and an N-channel transistor (not shown) (e.g., of another sub word line driver) positioned on the second adjacent side (e.g., the left side) of the center line along the first direction. The second N-channel transistor N2 may be positioned to be symmetric over the center line arranged along the first direction. If the second N-channel transistor N2 is a MOS (e.g., NMOS) transistor, the first conductive region may be a source/drain region and the second conductive region may be a drain/source region.

In the example embodiment of FIG. 4, the second N-channel transistor N2 and the first N-channel transistor N1 may be positioned such that the respective directions sharing the respective second conductive regions may be different. Contacts WC may be positioned at the first and second conductive regions of the first and second N-channel transistors N1 and N2 so as to be electrically connected with wire lines (e.g., on the right side 300).

In the example embodiment of FIG. 4, the third N-channel transistor N3 may have a gate region GL2 adjacent to the second N-channel transistor N2 and downward thereof in the first direction with a second direction being perpendicular to the first direction as a gate width direction. The third N-channel transistor N3 may have first and second conductive regions on adjacent sides (e.g., left and right sides) of the gate region GL2 with respect to the second direction.

In the example embodiment of FIG. 4, the fourth N-channel transistor N4 may include a gate region GL3 which may share the second conductive region with the third N-channel transistor N3. The fourth N-channel transistor N4 may be parallel to the gate region GL2 of the third N-channel transistor N3 and may have the second direction as a gate width direction. The fourth N-channel transistor N4 may have a first conductive region opposite of the second conductive region with respect to the gate region GL3.

In the example embodiment of FIG. 4, if the third and fourth N-channel transistors N3 and N4 are MOS (e.g., NMOS) transistors, the first conductive region may be a source/drain region and the second conductive region may be a drain/source region. Contacts WC, which may provide an electrical connection with the wire lines upward thereof, may electrically connect the first and second conductive regions of the third and fourth N-channel transistors N3 and N4.

In the conventional arrangement of FIG. 3, the third and fourth N-channel transistors N3 and N4 may have the same layout orientation as the first and second N-channel transistors N1 and N2. In contrast, in another example embodiment of the present invention, the third and fourth N-channel transistors N3 and N4 may be arranged with different orientations as compared to the first and second N-channel transistors N1 and N2, thereby reducing a layout area. For example, by sharing the second conductive region (e.g., by multiple transistors) and using the second direction as a gate width direction (e.g., perpendicular to the first direction), a higher integration of circuitry in a more efficient layout area may be achieved.

In another example embodiment of the present invention, referring to FIG. 4, the transistors P1, P2, N1, N2, N3 and N4 may have a Complementary Metal Oxide Semiconductor (CMOS) structure.

Figure 2:
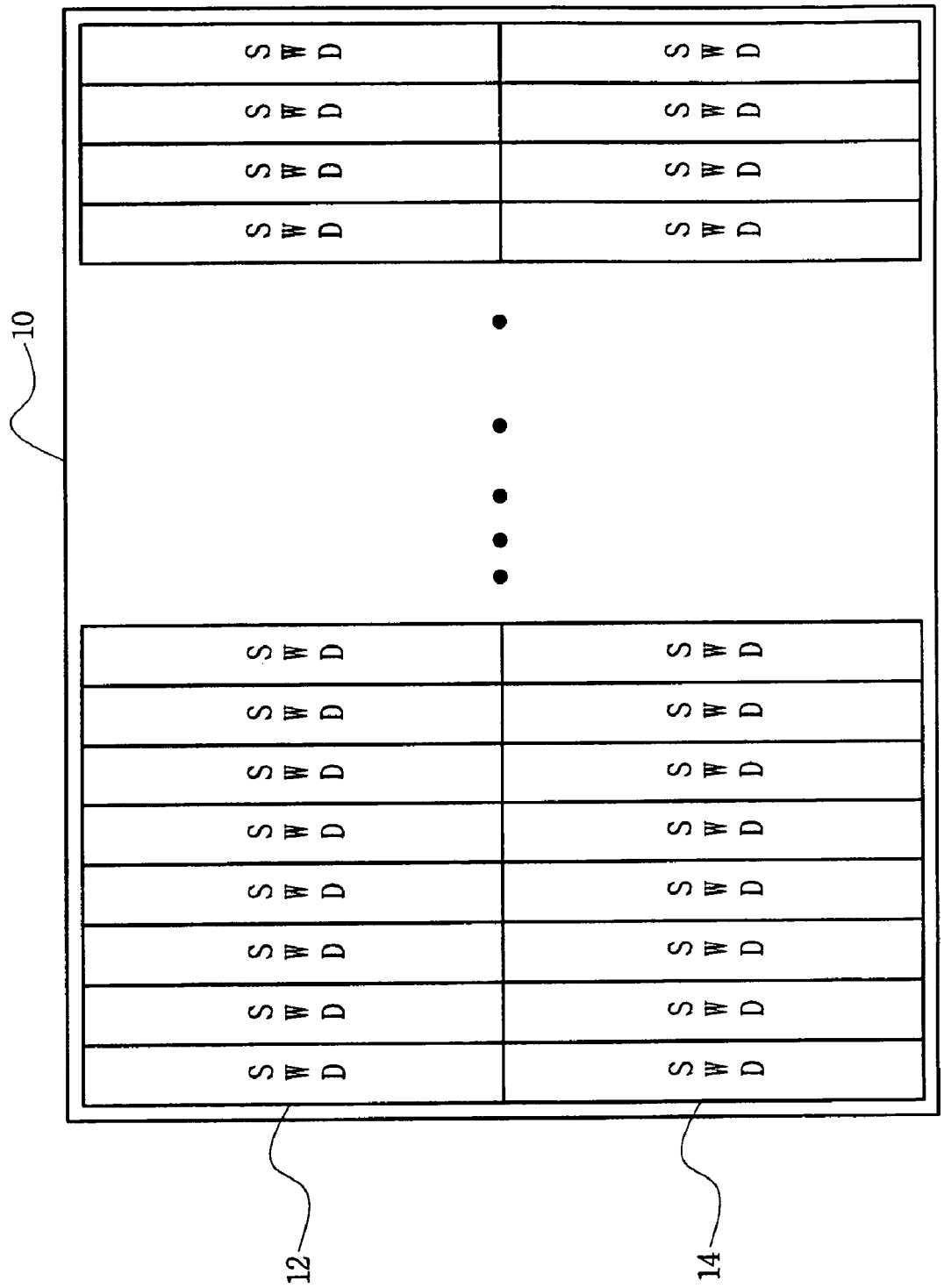
FIG. 2 illustrates a conventional sub word line driver block.

In the example embodiment of FIG. 4, the layout structure 400 may be repeated for a plurality of sub word line driver blocks (e.g., as shown in FIG. 2).

In the example embodiment of FIG. 4, the right side 300 may have a layout structure of the wire lines connected via contacts WC to the upper portion of the transistors P1, P2, N1, N2, N3 and N4. In an example, the wire lines may be formed together along with the formation of a bit line for forming a cell array region of a semiconductor memory device.

In the example embodiment of FIG. 4, a first conductive line ML0 may connect a first sub word line driver (e.g., sub word line driver 12) with a first word line WL0. The first conductive line ML0 may generally extend along the first direction and may be electrically connected the contacts WC of the first word lines WL0 along the first direction.

In the example embodiment of FIG. 4, the first conductive line ML0 may be connected to the first conductive regions of the first P-channel transistor P1, the first N-channel transistor N1 and the third N-channel transistor N3 via the contacts WC and may further dispose an insulating material on the transistors P1, N1 and N3. The first conductive line ML0 may be positioned such that a first portion of the first conductive line ML0 connected via the contacts WC of the first conductive regions of the transistors P1, N1 and N3 may have a wider width, and a second portion of the first conductive line ML0 without a connection to contacts WC may have a narrower width.

In the example embodiment of FIG. 4, a second conductive line ML1 may connect elements of a second word line WL1. The second conductive line ML1 may generally extend in the first direction and may be electrically connected to contacts WC of the second word line WL1.

In the example embodiment of FIG. 4, the second conductive line ML1 may be connected to the contacts WC on the first conductive regions of the second P-channel transistor P2, the second N-channel transistor N2 and the fourth N-channel transistor N4, and may be positioned so as to be spaced apart from the first conductive line ML0 (e.g., such that the first and second conductive lines ML0 and ML1 may not be electrically connected) while disposing an insulating material on the transistors P2, N2 and N4. The second conductive line ML1 may be positioned such that a first portion of the first conductive line ML1 connected via the contacts WC of the first conductive regions of the transistors P2, N2 and N4 may have a wider width, and a second portion of the second conductive line ML1 without a connection to contacts WC may have a narrower width.

In the example embodiment of FIG. 4, a conductive line ML9 may be connected in a downward or lower portion of the right side 300 on the portion PO1 (e.g., of the left side 200) on the common gate line GL1 between the second P-channel transistor P2 and the first N-channel transistor N1. The conductive line ML9 may be connected to a first input signal line (not shown), which may receive the first input signal A via a contact IC formed on the conductive line ML9.

In the example embodiment of FIG. 4, a conductive line (not shown) may be electrically connected to the gate regions GL2 and GL3 of the third and fourth N-channel transistors N3 and N4, respectively, for receiving the second input signal B. The second conductive regions of the first and second P-channel transistors P1 and P2 may be connected with a conductive line ML4 via their respective contacts WC, on which conductive line ML4 a power line (not shown) through contacts PC. An external power supply voltage VPP may be applied through the power line.

In the example embodiment of FIG. 4, the second conductive regions of the first to fourth N-channel transistors N1, N2, N3 and N4 may be connected with conductive lines ML11 and ML15, respectively, through respective contacts WC, on which conductive lines ML11 and ML15 may contact GC to establish a connection with a ground line having a ground voltage.

In the example embodiment of FIG. 4, the conductive lines ML1 and ML2 may "mirror" each other over a centerline (not shown) (e.g., oriented in the first direction) of the right side 300 of the layout area 400. Likewise, the conductive lines ML0 and ML3 may mirror each other across the center line of the right side 300. Similarly, the conductive lines ML5, ML8, ML10, ML12 and ML14 may mirror the conductive lines ML6, ML7, ML9, ML13, and ML15, respectively, across the center line of the right side 300. The layout area 400 of FIG. 4 may have a reduced layout area while performing the equivalent function of the circuit diagram of conventional FIG. 3

Figure 5:
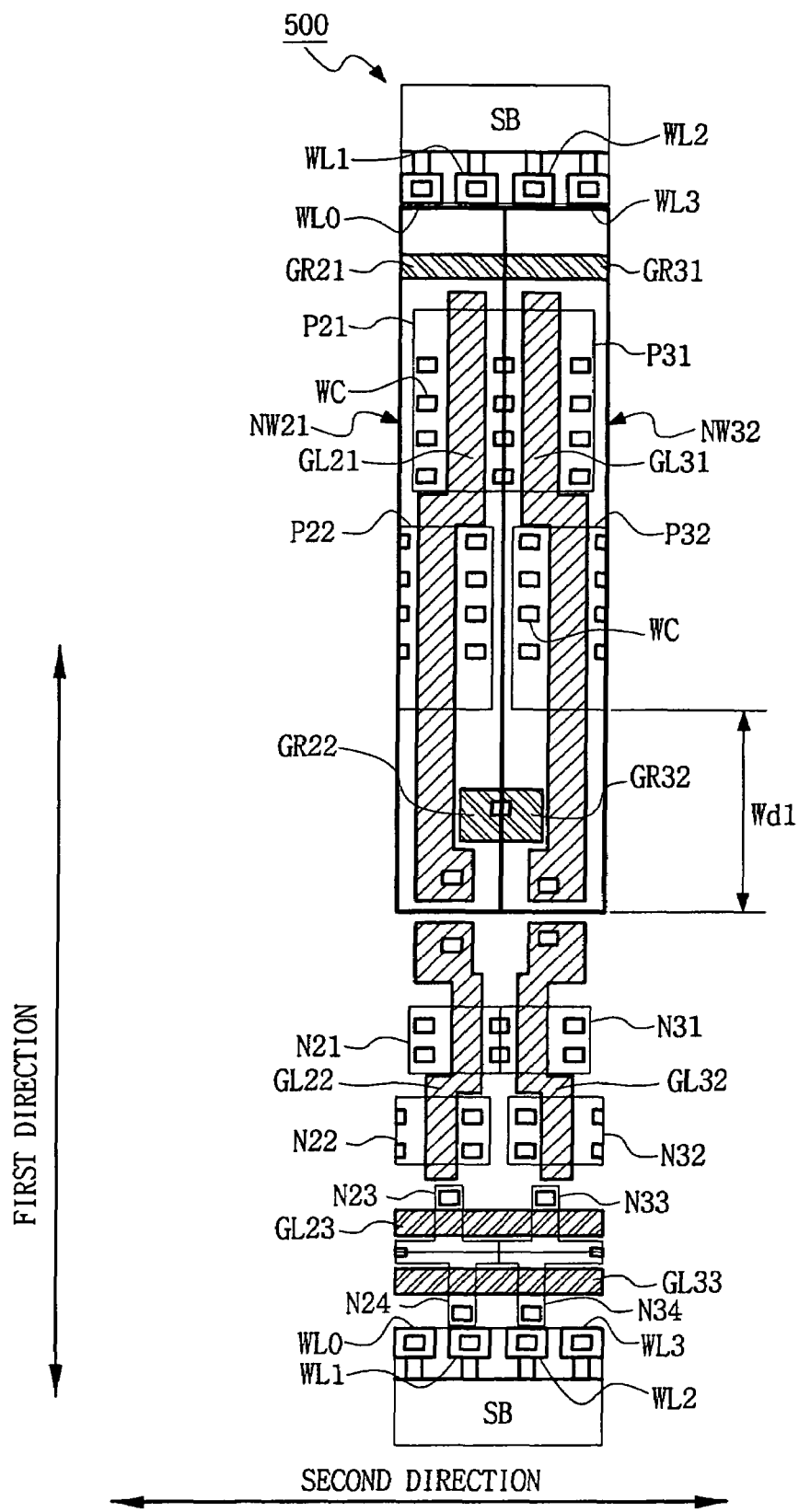
FIG. 5 illustrates a transistor layout structure according to another example embodiment of the present invention.

FIG. 5 illustrates a layout structure 500 for transistors according to another example embodiment of the present invention. In an example, the layout structure 500 of FIG. 5 may represent circuitry performing an equivalent function of the circuit diagram of FIG. 3.

In the example embodiment of FIG. 5, transistors P21, P22, N21, N22, N23 and N24 may correspond to the transistors P1, P2, N1, N2, N3 and N4 of FIG. 3, respectively. And an upper portion, a lower portion, a left side, and a right side which are to be described below are set on the basis of a first direction.

In the example embodiment of FIG. 5, a well region NW21 may be disposed on an upper portion of an array region for sub word line drivers at a fixed interval and length. The well region NW21 may be a region where a well may be defined to form the transistors P21 and P22. The well region NW21 may be elongatedly disposed along the first direction.

In the example embodiment of FIG. 5, a first active guard-ring GR21 for a well bias of the first and second P-channel transistors P21 and P22 may be disposed in an upper portion of the well region NW21, where "upper" may be relative to the first direction as illustrated in FIG. 5.

In the example embodiment of FIG. 5, a first gate line GL21 may be elongatedly disposed on a lower portion of an array region of the first active guard-ring GR21 on the well region NW21 along the first direction, where "lower" may be relative to the first direction as illustrated in FIG. 5. The first gate line GL21 may be disposed so as to extend up to a lower portion of the well region NW21 to be connected with an upper wiring through a contact.

In the example embodiment of FIG. 5, the first and second P-channel transistors P21 and P22 may be vertically disposed (e.g., disposed lengthwise along the first direction) adjacent to each other with the first gate line GL21 configured as a common gate. For example, the first P-channel transistor P21 may be disposed so as to have the first gate line GL21 configured as a gate region, and to have first and second conductive regions on left/right sides of the gate region, where "left" and "right" may be relative to the first direction as illustrated in FIG. 5. Thus, the first direction may become a gate width direction of the first P-channel transistor P21. The first P-channel transistor P21 may share the second conductive region with a P-channel transistor P31 associated with another sub word line driver disposed on the right side thereof (e.g., relative to the first direction as illustrated in FIG. 5), and may be disposed so as to have a structure that may be symmetric over the first direction.

In the example embodiment of FIG. 5, the second P-channel transistor P22 may be disposed so as to have the first gate line GL21 configured as a gate region, and to have first and second conductive regions on the right/left of the gate region, with "left" and "right" may be relative to the first direction as illustrated in FIG. 5. Similar to the first P-channel transistor 21, the second P-channel transistor P22 may be disposed with the first direction as a gate width direction. The second P-channel transistor P22 may share the second conductive region with a P-channel transistor (not shown) associated with another sub word line driver disposed on the left side thereof (e.g., relative to the first direction as illustrated in FIG. 5), and may be arranged so as to have a structure that may be symmetric over the first direction. In an example, if the second P-channel transistor P22 is a MOS transistor, the first conductive region may be a source/drain region, and the second conductive region may be a drain/source region.

In the example embodiment of FIG. 5, the second P-channel transistor P22 and the first P-channel transistor P21 may be configured such that the first and second conductive regions may be positioned on opposite sides of the first gate line GL21. The first and second P-channel transistors may thereby cross each other by a width of one pitch with respect to the second direction. Contacts WC may be disposed at the first and second conductive regions of the first and second P-channel transistors P21 and P22 so as to be electrically connected with wire lines.

In the example embodiment of FIG. 5, a second active guard ring GR22 for a well bias may be disposed on a lower portion of the well region NW21, where "lower" may be relative to the first direction as illustrated in FIG. 5. The second active guard ring GR22 may be disposed so as not to directly contact the first gate line GL21 which may extend down to the lower portion of the well region NW21.

In the example embodiment of FIG. 5, the active guard rings GR21 and GR22 may reduce (e.g., prevent or minimize) a latch-up phenomenon generated by the first and second P-channel transistors P21 and P22. Thus, for P-channel transistors, active guard rings may be employed for the well bias. In an alternative example, for N-channel transistors, active guard ring may be employed for a sub bias.

In the example embodiment of FIG. 5, a second gate line GL22 may be elongatedly disposed on the lower portion of the well region NW21, where "lower" may be relative to the first direction as illustrated in FIG. 5. A contact may be disposed on an upper portion (e.g., relative to the first direction of FIG. 5) of the second gate line GL22, thereby electrically connecting the second gate line GL22 with wire lines. The first and second N-channel transistors N21 and N22 may be vertically disposed adjacent to each other with the second gate line GL22 configured as a common or shared gate.

In the example embodiment of FIG. 5, the first N-channel transistor N21 may employ the second gate line GL22, which may receive a first input signal A, as a gate region. The first N-channel transistor N21 may include first and second conductive regions disposed on the left and right sides (e.g., relative to the first direction of FIG. 5) of the gate region. The first N-channel transistor N21 may thereby be disposed with the first direction as a gate width direction. The first N-channel transistor N21 may share the second conductive region with an N-channel transistor N31 associated with another sub word line driver disposed on the right side thereof (e.g., relative to the first direction of FIG. 5), and may be disposed so as to have a symmetric structure with respect to the first direction. In an example, if the first N-channel transistor N21 is an MOS transistor, the first conductive region may be a source/drain region, and the second conductive region may be a drain/source region.

In the example embodiment of FIG. 5, the second N-channel transistor N22 may be disposed adjacent to the first N-channel transistor N21, may employ the second gate line GL22 as a gate region, and may include first and second conductive regions on the right/left sides (e.g., relative to the first direction of FIG. 5) of the gate region, respectively. The second N-channel transistor N2 may also be disposed with the first direction as a gate width direction. The second N-channel transistor N22 may share the second conductive region with an N-channel transistor (not shown) associated with another sub word line driver disposed on the left side thereof (e.g., relative to the first direction of FIG. 5), and disposed so as to have a symmetric structure with respect to the first direction. In an example, if the second N-channel transistor N22 is an MOS transistor, the first conductive region may be a source/drain region, and the second conductive region may be a drain/source region.

In the example embodiment of FIG. 5, the second N-channel transistor N22 and the first N-channel transistor N21 may be configured such that the first and second conductive regions may be positioned on opposite sides of the first gate line GL22. The first and second N-channel transistors may N21 and N22 may thereby cross each other by a width of one pitch with respect to the second direction. Contacts WC may be disposed at the first and second conductive regions of the first and second N-channel transistors N21 and N22 so as to be electrically connected with wire lines.

In the example embodiment of FIG. 5, third and fourth gate lines GL23 and GL33 may be juxtaposed on the lower portion (e.g., with respect to the first direction of FIG. 5) of the second N-channel transistor N22, and may be elongatedly disposed with respect to the second direction (e.g., perpendicular to the first direction as illustrated in FIG. 5). The third and fourth gate lines GL23 and GL33 may include contact regions for connecting with wire lines.

In the example embodiment of FIG. 5, a third N-channel transistor N23 may be disposed which may employ the third gate line GL23 as a gate, may be configured with the second direction as a gate width direction, and may include first and second conductive regions on upper and lower regions (e.g., relative to the first direction of FIG. 5) with respect to the third gate line GL23.

In the example embodiment of FIG. 5, a fourth N-channel transistor N24 may be disposed which may share a second conductive region with the third N-channel transistor N23, may employ the fourth gate line GL33 as a gate, and may be configured with the second direction as a gate width direction. The fourth N-channel transistor N24 may include a first conductive region on an opposite side of the second conductive region with respect to the fourth gate line GL33.

In the example embodiment of FIG. 5, the first conductive region of each of the third and fourth N-channel transistors N23 and N24 may be disposed so as to have an area smaller than that of the second conductive region that may be shared by the third and fourth N-channel transistors N23 and N24. Accordingly, as illustrated in FIG. 5, the third and fourth N-channel transistors N23 and N24 may be disposed so as to have a "T" shape.

In an example, the "T" shaped arrangement may be possible because, at the time of operation of the sub word line driver, the third and fourth N-channel transistors N23 and N24 may not be subjected to operational restrictions despite their smaller size. With the above-described example layout structure 500 of FIG. 5, an area around the first conductive region of each of the third and fourth N-channel transistors N23 and N24 may be increased due to a more efficient layout. An example use of the extra area attained by the layout structure 500 of FIG. 5 will be described later with reference to FIG. 6.

In the example embodiment of FIG. 5, if the third and fourth N-channel transistors N23 and N24 are MOS transistors, first conductive regions of the third and fourth N-channel transistors N23 and N24 may be source/drain regions second conductive regions of the third and fourth N-channel transistors N23 and N24 may be drain/source regions. The first and second conductive regions of the third and fourth N-channel transistors N23 and N24 may include contacts WC for electrically connecting with wire lines.

In the example embodiment of FIG. 5, a layout structure of wire lines to be connected to each of the transistors P21, P22, N21, N22, N23 and N24 will be readily understood by those skilled in the art with reference to the description of the right side 300 of FIG. 4, and as such a description of additional example wire layouts will be omitted for the sake of brevity.

Figure 6:
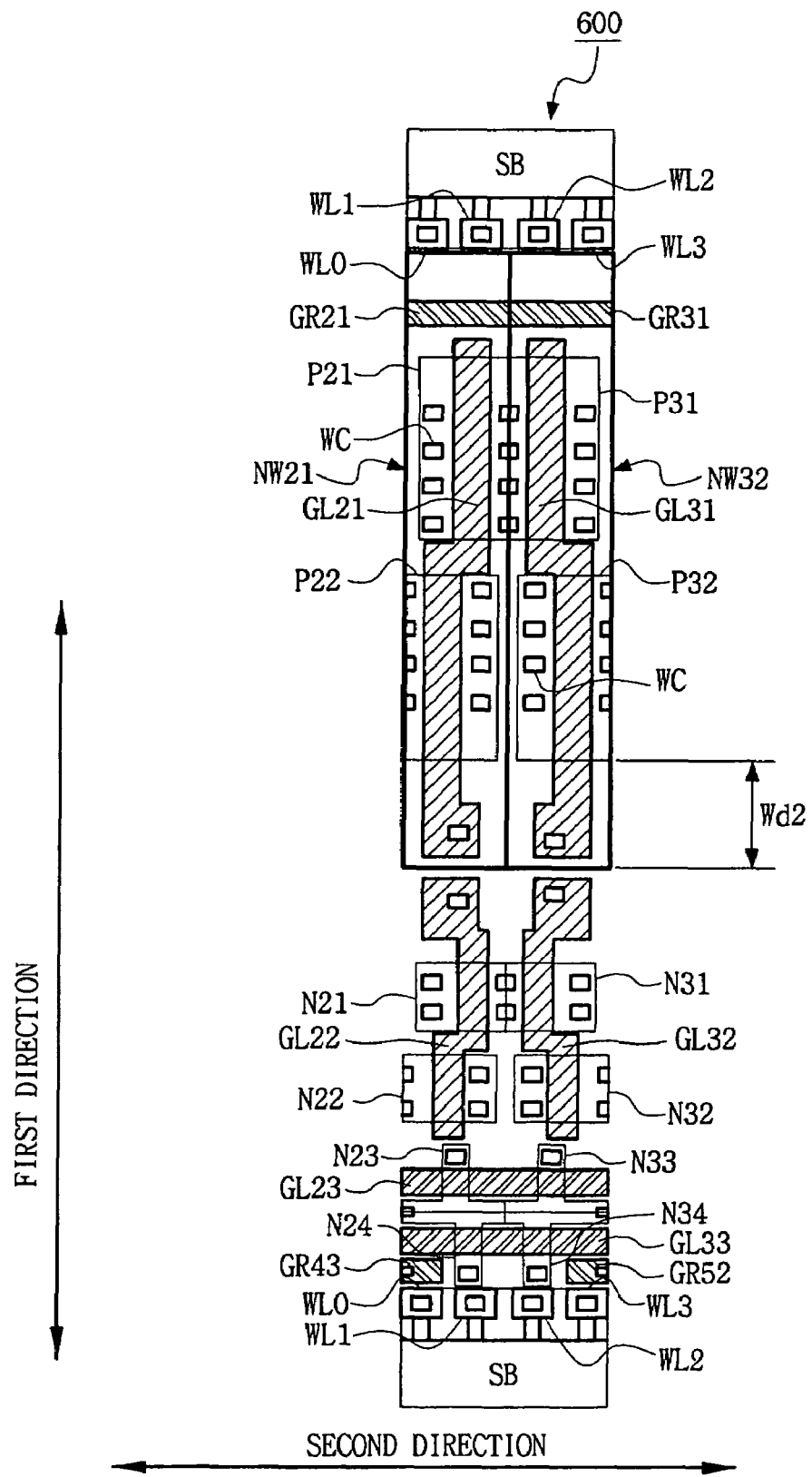
FIG. 6 illustrates a transistor layout structure according to another example embodiment of the present invention.

FIG. 6 illustrates a layout structure 600 for transistors according to another example embodiment of the present invention. In an example, the layout structure 600 of FIG. 6 may represent circuitry performing an equivalent function of the circuit diagram of FIG. 3.

In the example embodiment of FIG. 6, the layout structure 600 may be identical to the layout structure 500 of FIG. 5 except for a size of the well region NW21 and an array structure of an active guard ring GR43. Accordingly, a description of the previously described portions of the layout structure 600 of FIG. 6 will be omitted for the sake of brevity.

In the example embodiment of FIG. 6, a size of the well region NW21 may be decreased as compared to the example embodiment of FIG. 5. As shown in FIG. 6, regions other than the first and second P-channel transistors P21 and P22 may be reduced within the well region NW21.

In the example embodiment of FIG. 6, if the region Wd1 of FIG. 5 is reduced by removing the second active guard ring GR22 for the well bias, a region Wd2 as shown in FIG. 6 may result. However, a replacement guard ring (e.g., replacing the removed second active guard ring GR22) may be included in a region other than the well region NW21 for the well bias reducing (e.g., preventing or minimizing) the latch-up.

Accordingly, as shown in the example embodiment of FIG. 6, an active guard ring GR 43 for a sub bias may be disposed adjacent to the first conductive region of the fourth N-channel transistor N24. The first conductive region of each of the third and fourth N-channel transistors N23 and N24 may be disposed so as to have an area smaller than that of the second conductive region that is shared by the third and fourth N-channel transistors N23 and N24.

In the example embodiments of FIGS. 4-6, transistor layout structures 200/500/600 for each of the first and second sub word line drivers have been described. It is understood that transistor layout structures for each of the third and fourth sub word line drivers, which may be arranged symmetrically over a line along the first direction with respect to the first and second sub word line drivers, has not been described as its implementation will be readily apparent to those of ordinary skill in the art in view of the above-description of the example embodiments of FIGS. 4-6.

In another example embodiment of the present invention, a layout structure may be provided for sub word line drivers arranged between adjacent sub array blocks and connected with a plurality of memory cells for enabling a word line with a common input signal. The sub word line drivers may be arranged at the adjacent sub array blocks such that a layout area may be reduced, thereby increasing an integration characteristic of a semiconductor memory device.

Example embodiments of the present invention being thus described, it will be obvious that the same may be varied in many ways. For example, the shape or length of the transistors or the conductive lines may be modified into various shapes or lengths, and is not intended to be limited to the shapes/lengths described above and illustrated in FIG. 4. Further, while example embodiments have been above described with respect to "upward" and/or "downward" with respect to the first and second directions of FIG. 4, it is understood that this description may be based on the particular orientation of the layout area 400 illustrated in FIG. 4. Other example embodiments of the present invention, however, may be configured for any orientation, and as such the relative terminology given above may be modified accordingly. Further, the above-described "center" line is a relative term, and other example embodiments of the present invention may position the line of symmetry in any position.

Further, while above-described example embodiments of the present invention are directed to layout structures of sub word line drivers with a particular number and arrangement of transistors, conductive lines, word line drivers, etc., it is understood that other example embodiments may be expanded or reduced so as to scale for any semiconductor memory device. It is understood that such scaling may require modifications to the example embodiments of the present invention given above which are well within the capacity of one of ordinary skill in the art.

Such variations are not to be regarded as departure from the spirit and scope of example embodiments of the present invention, and all such modifications as would be obvious to one skilled in the art are intended to be included within the scope of the following claims.

What is claimed is:

1. A layout structure for a first sub word line driver positioned between first and second sub array blocks, comprising:
at least one N-channel transistor arrangement having a cross sectional width and a cross sectional length, the N-channel transistor arrangement oriented such that the cross sectional length extends along a first direction, the first direction oriented along the sub word line driver from the first sub array block to the second sub array block.

2. The layout structure of claim 1, wherein the at least one N-channel transistor arrangement includes first and second N-channel transistors, the first and second N-channel transistors being adjacent and sharing a conductive region.

3. The layout structure of claim 1, further comprising:
first and second P-channel transistors and first and second N-channel transistors having a common gate line as a gate region, the common gate line extending along the first direction, the first and second P-channel transistors and the first and second N-channel transistors adjacent to each other,
wherein the at least one N-channel transistor arrangement includes third and fourth N-channel transistors sharing a conductive region.

4. The layout structure of claim 3, further comprising:
a first sub word line driver having wire lines connected with the first P-channel transistor, the first N-channel transistor and the third N-channel transistor; and
a second sub word line driver having wire lines connected with the second P-channel transistor, the second N-channel transistor and the fourth N-channel transistor.

5. The layout structure of claim 4, wherein
a first word line driven by the first sub word line driver is connected with a first conductive line, the first conductive line being arranged above the first word line and extending along the first direction, the first conductive line connected to first conductive regions of the first P-channel transistor, the first N-channel transistor and the third N-channel transistor, respectively,
a second word line driven by the second sub word line driver is connected with a second conductive line, the second conductive line being arranged above the second word line and extending along the first direction, the second conductive line connected to second conductive regions of the second P-channel transistor, the second N-channel transistor and the fourth N-channel transistor, respectively,
the common gate line is connected with a first input signal line, gates of the third N-channel transistor and the fourth N-channel transistor are connected with a third conductive line, the first conductive regions of the first P-channel transistor and the second P-channel transistor are connected with a power line, and the second conductive regions of the first to fourth N-channel transistors are connected with a ground line.

6. The layout structure of claim 5, further comprising:
a second sub word line driver adjacent to the first sub word line driver.

7. The layout structure of claim 6, wherein the first P-channel transistor shares the second conductive region and a third P-channel transistor, the third P-channel transistor being a portion of the second sub word line driver.

8. The layout structure of claim 6, wherein the second P-channel transistor shares the second conductive region and a third P-channel transistor, the third P-channel transistor being a portion of the second sub word line driver.

9. The layout structure of claim 6, wherein the first N-channel transistor shares the second conductive region with a fifth N-channel transistor, the fifth N-channel transistor being a portion of the second sub word line driver.

10. The layout structure of claim 6, wherein the second N-channel transistor shares the second conductive region and a fifth N-channel transistor, the fifth N-channel transistor being a portion of the second sub word line driver.

11. The layout structure for sub word line drivers according to claim 6, wherein the first and second sub word line drivers are arranged in the same manner, the first and second sub array blocks having a plurality of word lines connected with a plurality of memory cells, the first and second sub word line drivers connected with different word lines of the plurality of word lines and driven by the same input signal.

12. The layout structure of claim 7, wherein the first and second sub word line drivers include transistors having a Complementary Metal Oxide Semiconductor (CMOS) structure.

13. The layout structure of claim 1, further comprising:
a common gate line arranged along the first direction;
a first P-channel transistor having the common gate line as a gate region and including first and second conductive regions arranged on first and second sides of the gate region, the first and second sides being formed a long a second direction with respect to the gate region, the second direction being perpendicular to the first direction;
a second P-channel transistor adjacent to the first P-channel transistor and having the common gate line as a gate region;
a first N-channel transistor adjacent to the second P-channel transistor having the common gate line as a gate region, and including first and second conductive regions on the left/right of the gate region with reference to the first direction; and
a second N-channel transistor adjacent to the first N-channel transistor having the common gate line as a gate region, and including first and second conductive regions on the left/right of the gate region with reference to the first direction,
wherein the at least one N-channel transistor arrangement includes a third N-channel transistor and a fourth N-channel transistor, the third and fourth N-channel transistors each having a gate region extending along the second direction.

14. The layout structure of claim 13, further comprising:
a first conductive line extending along the first direction and connected to a first word line, the first word line connected to the first conductive regions of the first P-channel transistor, the first N-channel transistor and the third N-channel transistor; and
a second conductive line extending along the first direction and connected to a second word line, the second word line connected to the first conductive regions of the second P-channel transistor, the second N-channel transistor and the fourth N-channel transistor.

15. The layout structure of claim 14, wherein
the common gate line between the second P-channel transistor and the first N-channel transistor is connected with a first input signal line, the first input line receiving a first input signal,
the gates of the third N-channel transistor and the fourth N-channel transistor, respectively, are connected with a third conductive line,
the second conductive regions of the first P-channel transistor and the second P-channel transistor, respectively, are connected with a power line, and
the second conductive regions of the first to fourth N-channel transistors, respectively, are connected with a ground line.

16. The layout structure of claim 1, further comprising:
first and second P-channel transistors disposed vertically adjacent to each other with respect to the first direction, the first and second P-channel transistors including a first gate line as a gate, the first gate line being elongatedly disposed on a well region in the first direction, the well region being disposed at a fixed width along a second direction and a fixed length along the first direction.

17. The layout structure of claim 16, wherein the at least one N-channel transistor arrangement includes first, second, third and fourth N-channel transistors,
the first and second N-channel transistors disposed on a first lower portion of the well region with respect the first direction so as to be vertically adjacent to each other, the first and second N-channel transistors including a second gate line as a gate, and
the third and fourth N-channel transistors disposed on a second lower portion with respect to the first direction so as to be vertically adjacent to each other, the third and fourth N-channel transistors including third and fourth gate lines, respectively, as gates, the third and fourth N-channel transistors sharing at least one conductive regions with each other, the third and fourth gate lines being elongatedly disposed in parallel in the second direction, the second direction perpendicular to the first direction.

18. The layout structure of claim 16, wherein the first P-channel transistor shares a first conductive region with a first other P-channel transistor adjacent to a right side of the first P-channel transistor with respect to the first direction, and the second P-channel transistor shares a second conductive region with a second other P-channel transistor adjacent to a left side of the second P-channel transistor with respect to the first direction.

19. The layout structure of claim 17, wherein the first N-channel transistor shares a first conductive region with a first other N-channel transistor adjacent to the right side of the first N-channel transistor with respect to the first direction, and the second N-channel transistor shares a second conductive region with a second other N-channel transistor adjacent to the left side of the second N-channel transistor with respect to the first direction.

20. The layout structure of claim 16, wherein the well region includes a plurality of guard rings for a well bias which are disposed within an upper portion of an array region of the first P-channel transistor and a lower portion of an array region of the second P-channel transistor, the upper and lower portions given with respect to the first direction.

21. The layout structure of claim 17, wherein the first and second P-channel transistors and the first and second N-channel transistors adopt the first direction as a gate width direction, and the third and fourth N-channel transistors adopt a second direction as a gate width direction, the second direction being perpendicular to the first direction.

22. The layout structure of claim 17, wherein the third and fourth N-channel transistors share a second conductive region, each of the third and fourth N-channel transistors including a first conductive region smaller than the second conductive region.

23. The layout structure of claim 22, wherein the well region includes a guard ring for a well bias disposed on an upper portion of an array region of the first P-channel transistor with respect to the first direction, and the second conductive region is opposite to a region on which a guard ring for sub bias is disposed, the guard ring for sub bias being disposed on a region other than the first conductive region of the fourth N-channel transistor.

24. The layout structure of claim 17, wherein the first P-channel transistor, the first N-channel transistor, and the third N-channel transistor are connected to first wire lines via first contacts to form a first sub word line driver, and the second P-channel transistor, the second N-channel transistor, and the fourth N-channel transistor are connected to second wire lines via second contacts to form a second sub word line driver.

25. A method of arranging a layout structure for a first sub word line driver positioned between first and second array blocks, comprising:
    forming a first at least one N-channel transistor arrangement having a cross sectional width and a cross sectional length, the cross sectional length extending along a first direction, the first direction oriented along the sub word line driver from the first sub array block to the second sub array block.

26. The method of claim 25, wherein the first at least one N-channel transistor arrangement includes first and second N-channel transistors sharing a conductive region.

27. The method of claim 25, wherein the cross sectional width of the at least one N-channel transistor arrangement extends along a second direction, the second direction being perpendicular to the first direction.

28. The method of claim 25, further comprising:
    forming a second at least one N-channel transistor arrangement in a second sub word line driver, the first and second sub word line drivers being adjacent and each positioned between the first and second sub array blocks.

29. A method of forming the layout structure of claim 1.

* * * * *